United States Patent
Khlat et al.

(10) Patent No.: US 9,516,693 B2
(45) Date of Patent: Dec. 6, 2016

(54) FAST TRANSITION ENVELOPE TRACKING

(71) Applicant: RF Micro Devices, Inc., Greensboro, NC (US)

(72) Inventors: Nadim Khlat, Cugnaux (FR); Michael R. Kay, Summerfield, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 14/838,515

(22) Filed: Aug. 28, 2015

(65) Prior Publication Data
US 2016/0088679 A1    Mar. 24, 2016

Related U.S. Application Data

(60) Provisional application No. 62/054,942, filed on Sep. 24, 2014.

(51) Int. Cl.
*H04B 1/04* (2006.01)
*H04W 76/04* (2009.01)

(52) U.S. Cl.
CPC .................. *H04W 76/046* (2013.01)

(58) Field of Classification Search
CPC ....... H03F 1/02; H03F 1/3247; H03F 1/0227
USPC ............ 455/127.1, 127.2, 138, 232.1, 245.1, 455/114.3, 194.2, 341
See application file for complete search history.

(56) References Cited

U.S. PATENT DOCUMENTS

| | | | | |
|---|---|---|---|---|
| 7,043,213 | B2* | 5/2006 | Robinson | H03F 1/0222 330/10 |
| 7,196,583 | B2* | 3/2007 | Clifton | H03F 1/0211 330/285 |
| 9,166,830 | B2* | 10/2015 | Camuffo | H03F 1/02 |
| 9,219,445 | B2* | 12/2015 | Nobbe | H03F 1/0227 |
| 9,263,997 | B2* | 2/2016 | Vinayak | H03F 1/0233 |
| 9,287,829 | B2* | 3/2016 | Nobbe | H03F 1/0227 |
| 2014/0155127 | A1* | 6/2014 | Dakshinamurthy | H04W 52/028 455/574 |
| 2015/0326186 | A1* | 11/2015 | Hong | H03F 1/0227 330/291 |

* cited by examiner

*Primary Examiner* — Sonny Trinh
(74) *Attorney, Agent, or Firm* — Withrow & Terranova, P.L.L.C.

(57) ABSTRACT

Envelope power supply circuitry is operated in one of an off-state, a standby-state, and a transmit-state. In the standby-state, select components in envelope power converter circuitry in the envelope power supply circuitry are turned on in order to charge one or more inductive and/or capacitive elements therein to a maximum value necessary for supporting transmission of signals about a maximum output power. Accordingly, the envelope power supply circuitry is able to prepare to support transmission about any output power without knowing the output power ahead of time.

22 Claims, 5 Drawing Sheets

FAST TRANSITION ENVELOPE TRACKING

RELATED APPLICATIONS

This application claims the benefit of U.S. provisional patent application No. 62/054,942, filed Sep. 24, 2014, the disclosure of which is incorporated herein by reference in its entirety.

FIELD OF THE DISCLOSURE

The present disclosure relates to envelope tracking methods and apparati, and specifically to envelope tracking capable of quickly transitioning between operating states.

BACKGROUND

Many modern electronic devices include wireless communications circuitry. For example, an electronic device may include wireless local area network (WLAN) communications circuitry, cellular communications circuitry, or the like. While wireless communications circuitry allows electronic devices to communicate with one another, such functionality generally comes at the cost of additional energy consumption and thus reduced battery life. Often, wireless communications circuitry is the largest consumer of energy in an electronics device. As wireless communications protocols evolve to provide higher speeds, energy consumption of communications circuitry often increases to meet the higher demands of such protocols.

Consumer demand for longer battery life from electronic devices has resulted in the development of many power-saving techniques for wireless communications. One way to conserve power consumed via wireless communications is through the use of envelope tracking. Envelope tracking involves modulating a supply voltage provided to an amplifier based on the instantaneous magnitude (i.e., the envelope) of an RF input signal provided to the amplifier. FIG. 1 illustrates the basic concept of envelope tracking. Specifically, FIG. 1 shows an amplitude-modulated RF signal 10. Conventionally, a constant supply voltage at a level sufficient to ensure adequate headroom across the entire amplitude range of the RF signal 10 would be supplied to an RF amplifier, as shown by line 12. This results in a significant amount of wasted energy, and thus poor efficiency, when the amplitude of the RF carrier is below the maximum level, as illustrated by line 14. Accordingly, an envelope power supply signal tracks the amplitude of the RF signal 10, as illustrated by line 16, and therefore increases efficiency by preventing the unnecessary expenditure of power when the amplitude of the RF signal 10 is below the maximum level.

While envelope tracking is a good way to decrease energy expenditure associated with wireless communications circuitry, it may not be compatible with wireless communications applications including strict timing requirements. For example, modern WLAN protocols generally require a transmitter to transition from an off-state to a transmit-state in less than ~10 µs. Further, the transmitter generally does not know the target output power until less than ~3 µs before transmission occurs. Generally, these stringent timing requirements are not problematic in transmitter applications that do not utilize envelope tracking, because the supply voltage to the transmitter is simply the battery voltage (which can be nearly instantaneously connected or disconnected to the transmitter). However, envelope power converter circuitry used to provide an envelope power supply signal to the transmitter generally utilizes switching power converter circuitry including significantly large inductive and capacitive elements. As will be appreciated by those of ordinary skill in the art, these inductive and capacitive elements restrict the ability of the envelope power converter circuitry to instantaneously provide a particular envelope power supply signal and therefore meet the timing requirements discussed above. Accordingly, envelope tracking has experienced slow adoption in WLAN applications and other wireless communications protocols with strict timing requirements.

In light of the above, there is a need for envelope tracking methods and apparati that are compatible with wireless communications protocols including strict timing requirements.

SUMMARY

The present disclosure relates to envelope tracking methods and apparati, and specifically to envelope tracking capable of quickly transitioning between operating states. In one embodiment, envelope power converter circuitry is configured to receive a supply voltage and an envelope power converter control signal and provide an envelope power supply signal to an amplifier. The envelope power converter circuitry includes a control amplifier, switching power converter circuitry, and supply voltage converter circuitry. The control amplifier is configured to receive the envelope power converter control signal, a converted supply voltage, and a feedback signal from an output of the envelope power converter circuitry and provide a control output current. The switching power converter circuitry is configured to provide at least a portion of the envelope power supply signal based on the control output current. The supply voltage converter circuitry is coupled to the control amplifier. The envelope power converter circuitry is configured to operate in a standby-state and a transmit-state. In the standby-state of the envelope power converter circuitry, the control amplifier and the switching power converter circuitry are powered off, and the supply voltage converter circuitry provides the converted supply voltage according to a maximum power demand of the control amplifier. In the transmit-state of the envelope power converter circuitry, the control amplifier and the switching power converter circuitry are powered on, and the supply voltage converter circuitry provides the converted supply voltage according to a known power demand of the control amplifier. By providing the converted supply voltage according to a maximum power demand of the control amplifier, the envelope power converter circuitry can charge one or more inductive and/or capacitive components therein to a level appropriate to support any desired transmit power from the amplifier. Accordingly, in the standby-state the envelope power converter circuitry is ready to support the transmission of signals at any transmit power without knowing a desired transmit power ahead of time.

In one embodiment, the envelope power converter circuitry further includes switching control circuitry coupled between the control amplifier and the switching power converter circuitry. The switching control circuitry may be configured to receive the control output current from the control amplifier and provide a switching control signal to the switching power converter circuitry.

In one embodiment, in an off-state of the envelope power converter circuitry, the control amplifier, the supply voltage converter circuitry, and the switching power converter circuitry are powered off.

In one embodiment, the envelope power converter circuitry further includes a supply converter holding inductor coupled between the supply voltage converter circuitry and the control amplifier and a supply converter smoothing capacitor coupled between the supply converter holding inductor and ground. In the standby-state of the envelope power converter circuitry, the supply converter holding inductor and the supply converter smoothing capacitor are charged by the supply voltage converter circuitry.

In one embodiment, the envelope power converter circuitry further includes voltage regulator circuitry configured to receive the supply voltage and provide a driver-stage power supply signal for an additional amplifier. In such an embodiment, in the standby-state of the envelope power converter circuitry, the voltage regulator circuitry provides the driver-stage power supply signal according to a maximum power demand of the additional amplifier. In the transmit-state of the envelope power supply circuitry, the voltage regulator circuitry provides the driver-stage power supply signal according to a known power demand of the additional amplifier. As discussed above, providing the driver-stage power supply signal according to a maximum power demand of the additional amplifier allows the envelope power converter circuitry to support the transmission signals at any transmit power from the driver-stage amplifier without knowing a target transmission power ahead of time.

In one embodiment, a switch is coupled between an output of the voltage regulator circuitry and an output of the supply converter holding inductor. The switch may be closed in the standby-state of the envelope power converter circuitry such that the voltage regulator circuitry can assist the supply voltage converter circuitry in charging the supply converter holding inductor and the supply converter smoothing capacitor. In one embodiment, a driver-stage power supply smoothing capacitor is also coupled to the output of the voltage regulator circuitry and charged during the standby-state of the envelope power converter circuitry.

In one embodiment, radio frequency (RF) transmitter circuitry includes a final-stage amplifier and envelope power converter circuitry. The final-stage amplifier is configured to receive an input signal and an envelope power supply signal and provide an RF output signal. The envelope power converter circuitry is configured to receive a supply voltage and an envelope power converter control signal and provide the envelope power supply signal. The envelope power converter circuitry includes a control amplifier, switching power converter circuitry, and supply voltage converter circuitry. The control amplifier is configured to receive the envelope power converter control signal, a converted supply voltage, and a feedback signal from an output of the envelope power converter circuitry and provide a control output current. The switching power converter circuitry is configured to provide at least a portion of the envelope power supply signal based on the control output current. The supply voltage converter circuitry is coupled to the control amplifier. The envelope power converter circuitry is configured to operate in a standby-state and a transmit-state. In the standby-state of the envelope power converter circuitry, the control amplifier and the switching power converter circuitry are powered off, and the supply voltage converter circuitry provides the converted supply voltage according to a maximum power demand of the control amplifier. In the transmit-state of the envelope power converter circuitry, the control amplifier and the switching power converter circuitry are powered on, and the supply voltage converter provides the converted supply voltage according to a known power demand of the control amplifier. By providing the converted supply voltage according to a maximum power demand of the control amplifier, the envelope power converter circuitry can charge one or more inductive and/or capacitive components therein to a level appropriate to support any desired transmit power from the amplifier. Accordingly, in the standby-state the envelope power converter circuitry is ready to support the transmission of signals at any transmit power without knowing a desired transmit power ahead of time.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Figure 1:
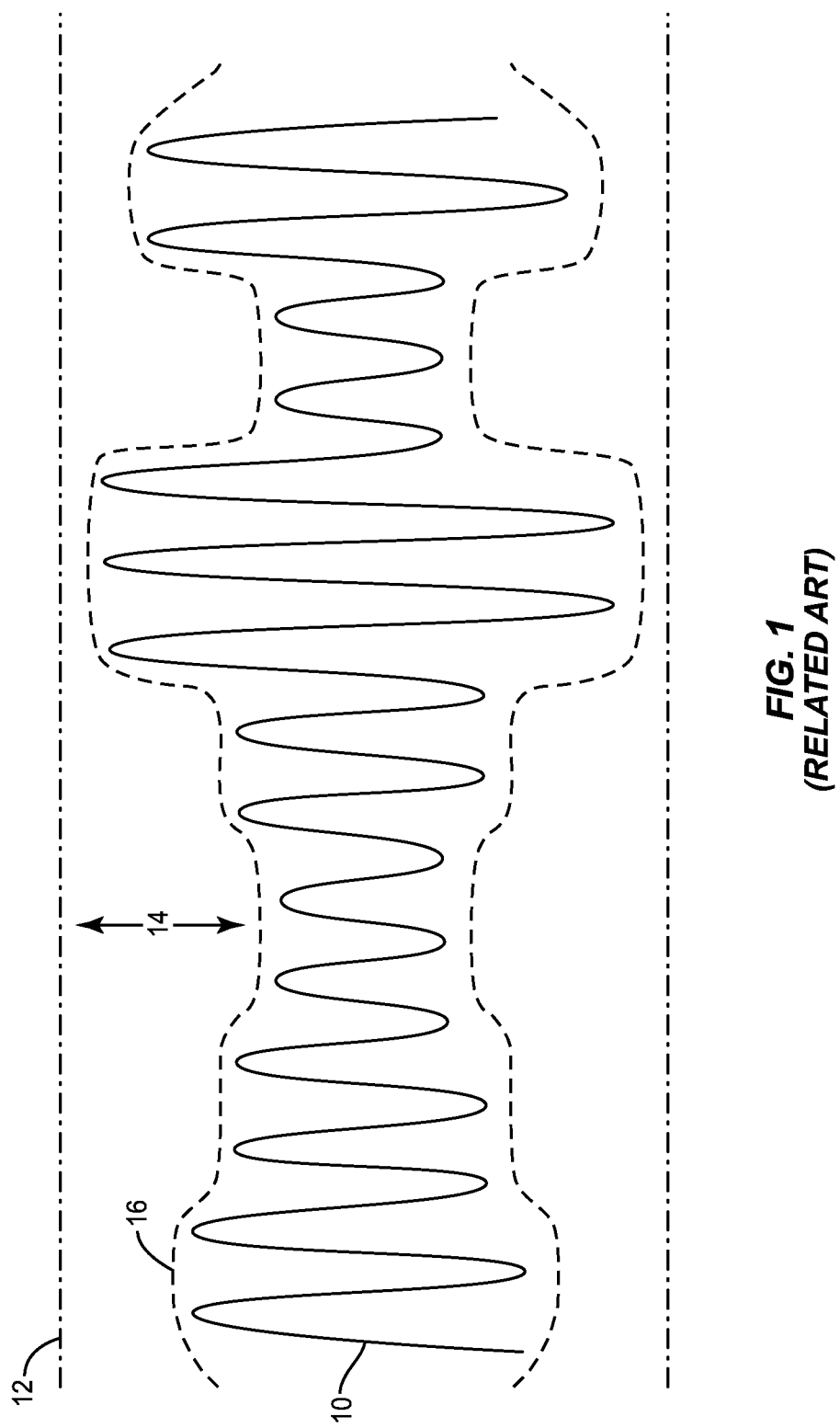
FIG. 1 is a graph illustrating the basic concepts of an envelope tracking power supply modulation scheme.
Figure 2:
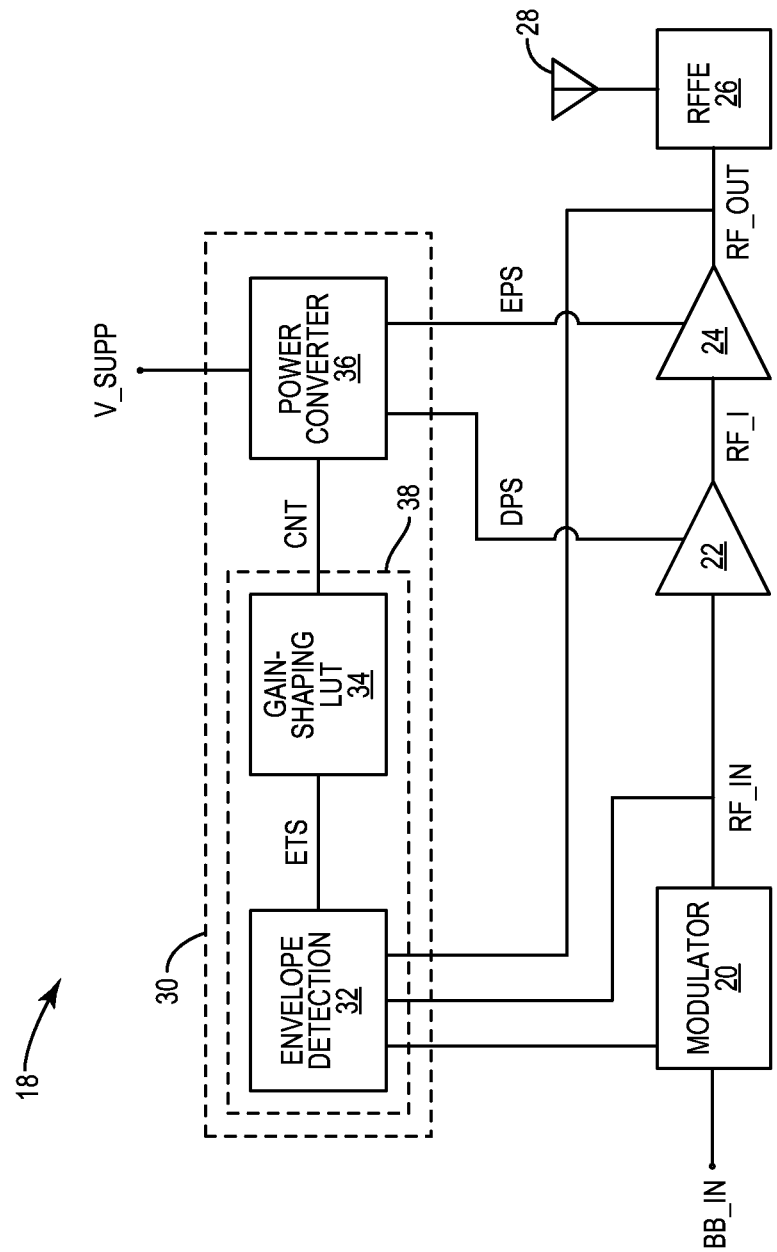
FIG. 2 is a diagram illustrating a radio frequency (RF) transmitter according to one embodiment of the present disclosure.

FIG. 2 is a diagram of a radio frequency (RF) transmitter 18 according to one embodiment of the present disclosure. The RF transmitter 18 includes modulator circuitry 20 configured to receive a baseband input signal BB_IN and provide an RF input signal RF_IN to a driver-stage amplifier 22. The driver-stage amplifier 22 amplifies the RF input signal RF_IN using a driver-stage power supply signal DPS to provide an intermediate RF signal RFI to an input of a final-stage amplifier 24. The final-stage amplifier 24 amplifies the intermediate RF signal RF_I using an envelope power supply signal EPS to provide an RF output signal RF_OUT to RF front end circuitry 26. The RF front end circuitry 26 may appropriately filter the RF output signal RF_OUT and provide it to an antenna 28, which may be one of a number of antennas (not shown for purposes of clarity).

Envelope power supply circuitry 30 is coupled to one or more of the modulator circuitry 20, the input of the final-stage amplifier 24, and the output of the final-stage amplifier 24. The envelope power supply circuitry 30 includes envelope detection circuitry 32, a gain-shaping look-up table 34, and envelope power converter circuitry 36. Together, the envelope detection circuitry 32 and the gain-shaping look-up table 34 are referred to as envelope tracking circuitry 38. The envelope detection circuitry 32 may receive one or more of an envelope signal from the modulator (e.g., an in-phase component and a quadrature component of the baseband input signal BB_IN), the RF input signal RF_IN, and the RF output signal RF_OUT, and provide an envelope tracking signal ETS to the gain-shaping look-up table 34. The gain-shaping look-up table 34 receives the envelope tracking signal ETS and provides a gain-shaped envelope signal, referred to as an envelope power converter control signal CNT, to the envelope power converter circuitry 36 based thereon. The envelope power converter circuitry 36 receives the envelope power converter control signal CNT and a supply voltage V_SUPP and provides the envelope power supply signal EPS based thereon.

Conventional envelope power converter circuitry generally operates in one of an off-state and a transmit-state. As discussed in detail below, due to relatively large inductive and/or capacitive elements in the envelope power converter circuitry 36, transitioning from the off-state to the transmit-state may take a significant amount of time, and thus may interfere with the ability of the envelope power converter circuitry 36 to be used when the RF transmitter 18 is providing signals according to a wireless communications protocol with strict timing requirements. While avoidance of the off-state altogether would mitigate this problem, it also results in significant power consumption which degrades battery life. Accordingly, the envelope power converter circuitry 36 may be configured to operate in one of an off-state, a standby-state, and a transmit-state. In the standby-state, select components in the envelope power converter circuitry 36 are powered on in order to charge one or more inductive and/or capacitive elements in the envelope power converter circuitry 36 to a level capable of sustaining even the highest output power levels in the RF transmitter 18. The envelope power converter circuitry 36 may transition from the standby-state to the transmit-state relatively quickly, which may allow the circuitry to meet the demands of the strict timing requirements of a particular wireless communications protocol as discussed in detail below. During the transition between the standby-state and the transmit-state, the various voltages in the envelope power converter circuitry 36 may be adjusted as necessary without distorting the RF output signal RF_OUT.

Figure 3:
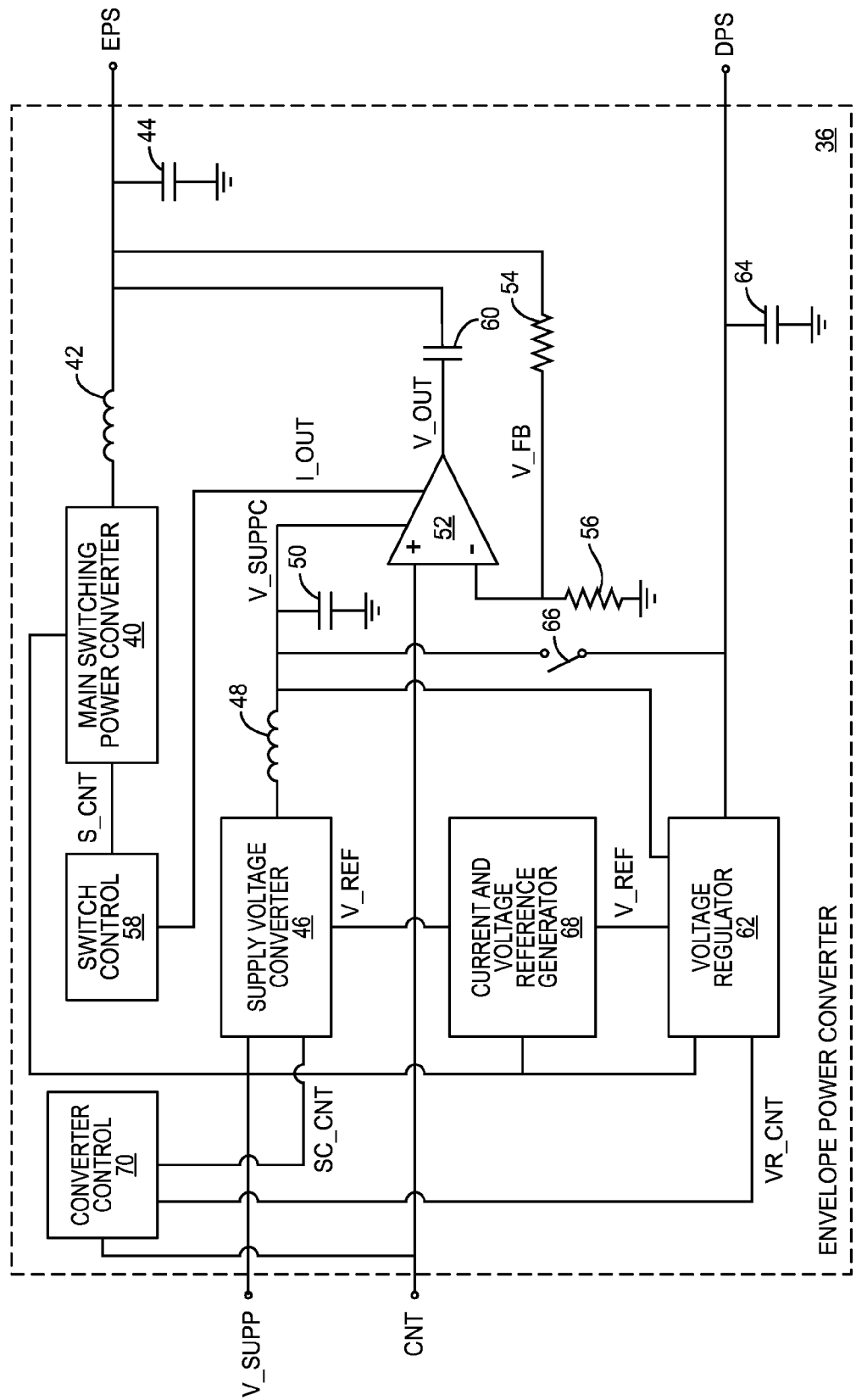
FIG. 3 is a diagram illustrating envelope power converter circuitry according to one embodiment of the present disclosure.

FIG. 3 is a diagram of the envelope power converter circuitry 36 according to one embodiment of the present disclosure. The envelope power converter circuitry 36 includes a main switching power converter circuitry 40 configured to receive the supply voltage V_SUPP and a switching control signal S_CNT and provide the envelope power supply signal EPS via a main holding inductor 42 and a main smoothing capacitor 44. Supply voltage converter circuitry 46 also receives the supply voltage V_SUPP and provides a converted supply voltage V_SUPPC via a supply converter holding inductor 48 and a supply converter smoothing capacitor 50 to a control amplifier 52. The control amplifier 52 receives the envelope power converter control signal CNT from the envelope tracking circuitry 38, and in particular from the gain-shaping look-up table 34. Further, the control amplifier 52 receives a feedback signal V_FB via a voltage divider formed from an isolation resistance 54 and a divider resistance 56 from an output of the envelope power converter circuitry 36. As will be appreciated by those of ordinary skill in the art, the control amplifier 52 may be an operational amplifier configured to equalize the envelope power converter control signal CNT and the feedback signal V_FB by changing an output voltage V_OUT and an output current I_OUT provided therefrom. The output current I_OUT from the control amplifier 52 may be delivered to switching control circuitry 58, which generates the switching control signal S_CNT based thereon. The output voltage V_OUT of the control amplifier 52 may be delivered to an output of the envelope power converter circuitry 36 via a bypass capacitor 60. In short, the main switching power converter circuitry 40 provides the majority of the envelope power supply signal EPS via the main holding inductor 42 based on control signals that are derived from the control amplifier 52. In situations in which the main switching power converter circuitry 40 cannot instantaneously provide a desired magnitude of the envelope power supply signal EPS, for example, when the timing allowed for a transition is too short, the control amplifier 52 may supplement the output of the main switching power converter circuitry 40 by sinking a voltage from the bypass capacitor 60.

Voltage regulator circuitry 62 also receives the supply voltage V_SUPP and provides a regulated version thereof as the driver-stage power supply signal DPS, which may be delivered via a driver-stage power supply smoothing capacitor 64. In some embodiments, the voltage regulator circuitry 62 may also receive the converted supply voltage V_SUPPC (which, while not shown, may be multiplexed with the supply voltage V_SUPP) and may use either the supply voltage V_SUPP or the converted supply voltage V_SUPPC based on the power requirements thereof. A switch 66 couples an output of the voltage regulator circuitry 62 to an output of the supply voltage converter circuitry 46, specifically between the supply converter holding inductor 48 and the supply converter smoothing capacitor 50. Current and voltage reference generator circuitry 68 supplies one or more reference voltages and/or reference currents (represented as V_REF) to the supply voltage converter circuitry 46 and the voltage regulator circuitry 62. Converter control circuitry 70 receives the envelope power converter control signal CNT and provides a supply voltage converter control signal SC_CNT to the supply voltage converter circuitry 46 and a voltage regulator control signal VR_CNT to the voltage regulator circuitry 62, respectively. The supply voltage converter control signal SC_CNT controls the magnitude of the converted supply voltage V_SUPPC, while the voltage regulator control signal VR_CNT controls the magnitude of the driver-stage power supply signal DPS.

The voltage regulator circuitry 62 may be a low-dropout (LDO) voltage regulator. Accordingly, the voltage regulator circuitry 62 may be unsuitable for envelope power supply modulation. The driver-stage power supply signal DPS may therefore be a constant or average power tracking signal that is not envelope modulated. However, the principles of the present disclosure may equally apply to situations in which both the driver-stage amplifier 22 and the final-stage amplifier are both provided envelope modulated power supply signals, or to situations in which only the driver-stage amplifier 22 is provided an envelope modulated power supply signal.

As discussed above, the envelope power supply circuitry 30 may be required to transition between operating states quickly. For example, in wireless local area network (WLAN) communications systems, a transmitter generally has less than ~10 μs to transition from an off-state to a transmit-state. Further, a target transmit power is only known less than ~3 μs before transmission occurs. Conventionally, envelope power converter circuitry 36 would power on when the target transmit power is known and attempt to provide the envelope power supply signal EPS accordingly. However, due to the very short transition period in WLAN communications systems, such an approach is not feasible. In general, inductive and capacitive components such as the supply converter holding inductor 48, the supply converter smoothing capacitor 50, and the driver-stage power supply smoothing capacitor 64 will limit the ability of the envelope power converter circuitry 36 to instantaneously provide the envelope power supply signal EPS at a desired magnitude. In other words, these inductive components need time to "charge" the magnetic field thereof.

Accordingly, a standby mode of operation is proposed, wherein specific components of the envelope power converter circuitry 36 are powered on in order to ready the circuitry for transmission. This is generally done ~10 μs before transmission, when knowledge that the transmission should occur is first obtained. Specifically, the supply voltage converter circuitry 46, the voltage regulator circuitry 62, the current and voltage reference generator circuitry 68, and the converter control circuitry 70 are powered on so that the components associated therewith are given time to settle. Since the target transmit power is not yet known at this time, the supply voltage converter circuitry 46 and the voltage regulator circuitry 62 are instructed by the converter control circuitry 70 to provide the converted supply voltage V_SUPPC and the driver-stage power supply signal DPS at the maximum possible values thereof. When the target transmit power is known at ~3 μs, the converter control circuitry 70 then instructs the supply voltage converter circuitry 46 and the voltage regulator circuitry 62 to adjust the converted supply voltage V_SUPPC and the driver-stage power supply signal DPS as needed.

Figure 4:
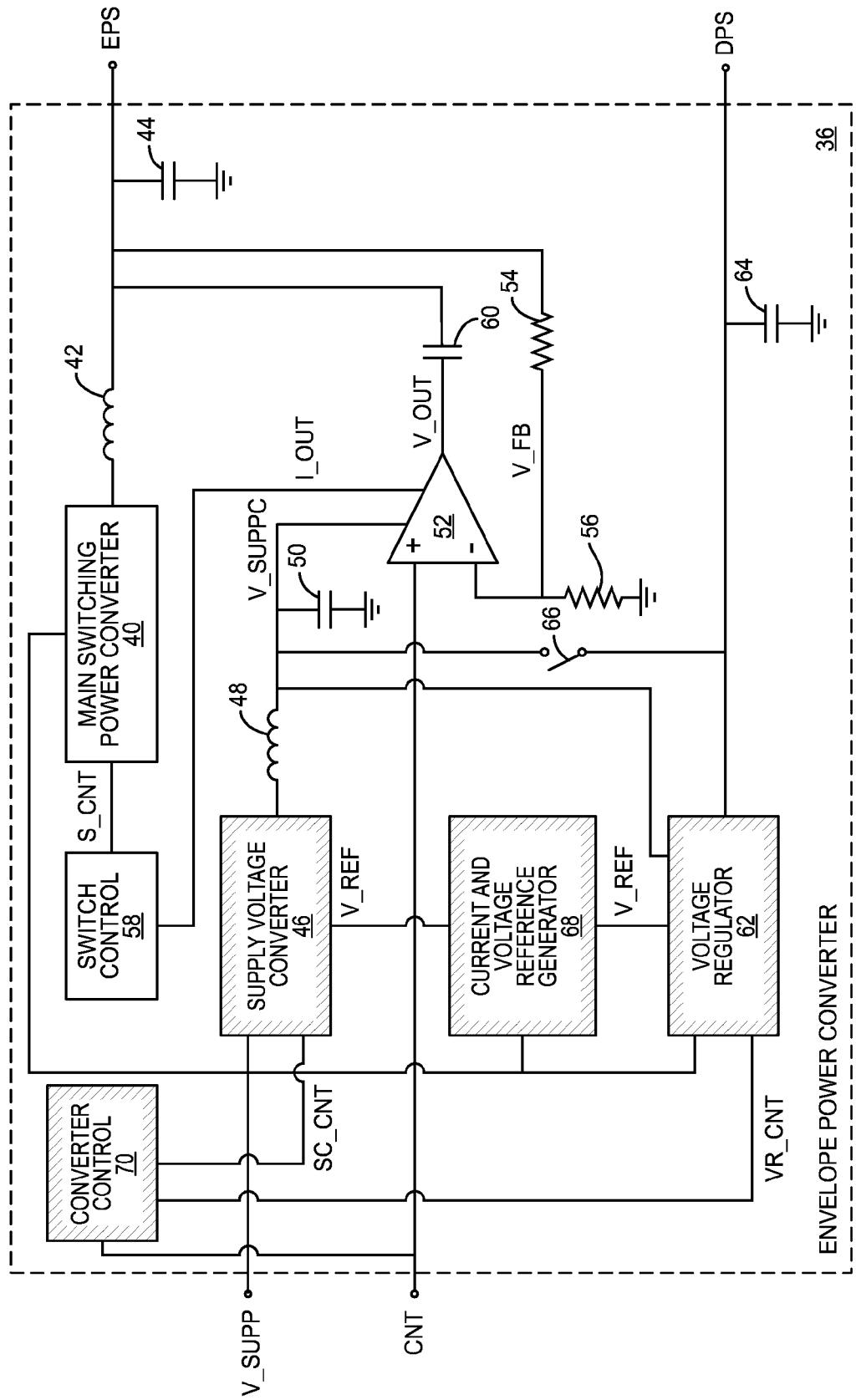
FIG. 4 is a diagram illustrating envelope power converter circuitry according to an additional embodiment of the present disclosure.

FIG. 4 shows a visual representation of the standby mode of the envelope power converter circuitry 36. Specifically, FIG. 4 shows the supply voltage converter circuitry 46, the voltage regulator circuitry 62, the current and voltage reference generator circuitry 68, and the converter control circuitry 70 as shaded, indicating that they are turned on. When the supply voltage converter circuitry 46, the voltage regulator circuitry 62, the current and voltage reference generator circuitry 68, and the converter control circuitry 70 are turned on, the supply converter holding inductor 48 and the supply converter smoothing capacitor 50 are charged by the supply voltage converter circuitry 46. Since these components generally take the longest amount of time to charge and settle, charging these components in the standby mode of operation ensures that the envelope power converter circuitry 36 is ready to transmit on short notice.

As discussed above, the target transmit power is not initially known by the RF transmitter 18. Accordingly, the converter control circuitry 70 provides the supply converter control signal S_CNT such that the supply voltage converter circuitry 46 provides the converted supply voltage V_SUPPC at its maximum value. As will be appreciated by those of ordinary skill in the art, the converted supply voltage V_SUPPC is generally provided based on the target output power of the RF transmitter 18 in order to provide adequate headroom in the envelope power supply signal EPS to avoid distortion, while also expending the least amount of power. Providing the converted supply voltage V_SUPPC at its maximum value allows for the transmission at any output power, thereby ensuring that distortion does not occur in the RF output signal RF_OUT due to clipping. Similarly, the converter control circuitry 70 provides the voltage regulator control signal VR_CNT such that the voltage regulator circuitry 62 provides the driver-stage power supply signal DPS at its maximum value. Providing the driver-stage power supply signal DPS at its maximum value ensures that the intermediate RF signal RF_I is similarly not clipped in order to avoid distortion.

Further as discussed above, the supply converter holding inductor 48, the supply converter smoothing capacitor 50, and the driver-stage power supply smoothing capacitor 64 are generally the limiting components in the operating speed of the envelope power converter circuitry 36. This is due to the fact that these components are generally quite large (e.g., ~2 μH, ~1 μF, and ~1 μF, respectively), and thus take a significant amount of time to "charge" and settle. With respect to the supply converter holding inductor 48 and the supply converter smoothing capacitor 50, this is further exacerbated by the fact that the supply voltage converter circuitry 46 is generally a compact power converter that provides a relatively small current. The ability of the supply voltage converter circuitry 46 to quickly charge the supply converter holding inductor 48 and the supply converter smoothing capacitor 50 is therefore limited. Accordingly, a switch is provided between the output of the voltage regulator circuitry 62 and the output of the supply voltage converter circuitry 46. Specifically, the switch is provided between the supply converter holding inductor 48 and the supply converter smoothing capacitor 50. In one embodiment, the switch 66 is turned on when the envelope power converter circuitry 36 is operating in the standby mode of operation. Turning the switch on allows the voltage regulator circuitry 62, which may provide significantly more power than the supply voltage converter circuitry 46, to charge the supply converter holding inductor 48 and the supply converter smoothing capacitor 50. Notably, while the output of the voltage regulator circuitry 62 is coupled to the driver-stage amplifier 22, the driver-stage amplifier 22 is powered down at this time, such that current does not flow thereto. So that the voltage provided from the supply voltage converter circuitry 46 and the voltage regulator circuitry 62 is the same, the converter control circuitry 70 may instruct the supply voltage converter circuitry 46 and the voltage regulator circuitry 62 to provide the same output voltage via the supply converter control signal SC_CNT and the voltage regulator control signal VR_CNT, respectively.

Once the target transmit power is known, the converter control circuitry 70 may instruct the supply voltage converter circuitry 46 to appropriately adjust the converted supply voltage V_SUPPC based on the requirements of the control amplifier 52. Further, the converter control circuitry 70 may instruct the voltage regulator circuitry 62 to adjust the driver-stage power supply signal DPS based on the requirements of the driver-stage amplifier 22. Since these adjustments will inevitably involve either reducing the converted supply voltage V_SUPPC and/or the driver-stage power supply signal DPS or simply not adjusting them, distortion is avoided, since adequate headroom is maintained for amplification throughout the process.

Notably, while the converter control circuitry 70 is shown providing the supply converter control signal SC_CNT and the voltage regulator control signal VR_CNT, these signals may be provided from any suitable source. For example, in other embodiments the supply converter control signal SC CNT and the voltage regulator control signal VR_CNT are received via a communications bus, for example, from a central processor or control system. These control signals may be digital, and thus may be provided to the supply voltage converter circuitry 46 and the voltage regulator circuitry 62 via respective digital-to-analog converters (DACs).

Figure 5:
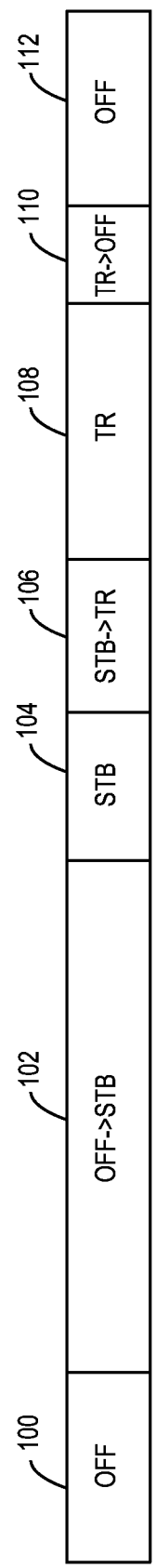
FIG. 5 is a timing diagram illustrating a method of performing envelope power supply modulation according to one embodiment of the present disclosure.

FIG. 5 is a timing diagram illustrating the relative timing of the various operational transitions in the envelope power converter circuitry 36. The envelope power converter circuitry 36 begins in an off-state (step 100). In the off-state of the envelope power converter circuitry 36, the various components therein are all powered down, such that the envelope power converter circuitry 36 consumes very little if any power. Next, the envelope power converter circuitry 36 transitions from an off-state to the standby-state (step 102). As discussed above, it may take the inductive and capacitive components some time to charge and settle, which is indicated by the relatively long time period of the off-state to standby-state transition. The envelope power converter circuitry 36 is then in the standby-state (step 104), and is ready to quickly transition to a transmit-state. It is during this time that the target transmit power is known by the RF transmitter 18. The envelope power converter circuitry 36 transitions from the standby-state to the transmit-state (step 106) by powering on the remaining components in the envelope power converter circuitry 36 such as the control amplifier 52, the main switching power converter circuitry 40, and the switching control circuitry 58.

Due to the fact that the main switching power converter circuitry 40 is significantly more powerful than the supply voltage converter circuitry 46, the main holding inductor 42 and the main smoothing capacitor 44 take much less time to charge and settle, and therefore do not limit the ability of the envelope power converter circuitry 36 to quickly transition into the transmit mode of operation. The converter control circuitry 70 may send the command to adjust the converted supply voltage V_SUPPC and the driver-stage power supply signal DPS at this time. Accordingly, during the transition from the standby-state to the transmit-state, the converted supply voltage V_SUPPC and the driver-stage power supply signal DPS may be lowered as necessary. The envelope power converter circuitry 36 then operates in transmit mode for some period of time (step 108). During this time, the converted supply voltage V_SUPPC and the driver-stage power supply signal DPS may continue to be adjusted as necessary. As discussed above, such adjustments will not cause distortion in the RF output signal RF_OUT. When transmission is completed, the envelope power converter circuitry 36 transitions from the standby-state back to the off-state (step 110). Finally, the envelope power converter circuitry 36 is placed back in the off-state (step 112) where the process may start over.

Those skilled in the art will recognize improvements and modifications to the embodiments of the present disclosure. All such improvements and modifications are considered within the scope of the concepts disclosed herein and the claims that follow.

What is claimed is:

1. Envelope power converter circuitry configured to receive a supply voltage and an envelope power converter control signal and provide an envelope power supply signal to an amplifier, the envelope power converter circuitry comprising:
   switching power converter circuitry configured to provide at least a portion of the envelope power supply signal based on a control output current;
   a control amplifier configured to receive the envelope power converter control signal, a converted supply voltage, and the portion of the envelope power supply signal provided by the switching power converter circuitry and provide the control output current; and
   supply voltage converter circuitry coupled to the control amplifier and configured to receive the supply voltage and provide the converted supply voltage, wherein:
      in a standby-state of the envelope power converter circuitry, the control amplifier and the switching power converter circuitry are powered off, and the supply voltage converter circuitry provides the converted supply voltage according to a maximum power demand of the control amplifier; and
      in a transmit-state of the envelope power converter circuitry, the control amplifier and the switching power converter circuitry are powered on, and the supply voltage converter circuitry provides the converted supply voltage according to a known power demand of the control amplifier.

2. The envelope power converter circuitry of claim 1 further comprising switching control circuitry coupled between the control amplifier and the switching power converter circuitry and configured to generate a switching control signal for the switching power converter circuitry based on the control output current.

3. The envelope power converter circuitry of claim 1 wherein in an off-state of the envelope power converter circuitry, the control amplifier, the supply voltage converter circuitry, and the switching power converter circuitry are powered off.

4. The envelope power converter circuitry of claim 1 further comprising:
   a supply converter holding inductor coupled between the supply voltage converter circuitry and the control amplifier; and
   a supply converter smoothing capacitor coupled between the supply converter holding inductor and ground.

5. The envelope power converter circuitry of claim 4 wherein in the standby-state of the envelope power converter circuitry, the supply converter holding inductor and the supply converter smoothing capacitor are charged by the supply voltage converter circuitry.

6. The envelope power converter circuitry of claim 1 further comprising voltage regulator circuitry configured to receive the supply voltage and provide a driver-stage power supply signal for an additional amplifier.

7. The envelope power converter circuitry of claim 6 wherein:
   in the standby-state of the envelope power converter circuitry, the voltage regulator circuitry provides the driver-stage power supply signal according to a maximum power demand of the additional amplifier; and
   in the transmit-state of the envelope power converter circuitry, the voltage regulator circuitry provides the driver-stage power supply signal according to a known power demand of the additional amplifier.

8. The envelope power converter circuitry of claim 7 further comprising:
   a supply converter holding inductor coupled between the supply voltage converter circuitry and the control amplifier;
   a supply converter smoothing capacitor coupled between the supply converter holding inductor and ground; and
   a driver-stage power supply smoothing capacitor coupled between an output of the voltage regulator circuitry and ground.

9. The envelope power converter circuitry of claim 8 further comprising a switch coupled between the output of the voltage regulator circuitry and the supply converter holding inductor.

10. The envelope power converter circuitry of claim 9 wherein:
in the standby-state of the envelope power converter circuitry, the switch is closed such that the voltage regulator circuitry is configured to assist the supply voltage converter circuitry in charging the supply converter holding inductor and the supply converter smoothing capacitor; and
in the transmit-state of the envelope power converter circuitry, the switch is open.

11. The envelope power converter circuitry of claim 1 wherein:
the standby-state is entered between about 5-8 µs before transmission of a wireless local area network (WLAN) signal from the amplifier; and
the transmit-state is entered between about 2-4 µs before transmission of a WLAN signal from the amplifier.

12. Radio frequency (RF) transmitter circuitry comprising:
a final-stage amplifier configured to receive an input signal and an envelope power supply signal and provide an RF output signal;
envelope power converter circuitry configured to receive a supply voltage and an envelope power converter control signal and provide the envelope power supply signal, the envelope power converter circuitry comprising:
switching power converter circuitry configured to provide at least a portion of the envelope power supply signal based on a control output current;
a control amplifier configured to receive the envelope power converter control signal, a converted supply voltage, and the portion of the envelope power supply signal from the switching power converter circuitry and provide the control output current; and
supply voltage converter circuitry coupled to the control amplifier and configured to receive the supply voltage and provide the converted supply voltage, wherein:
in a standby-state of the envelope power converter circuitry, the control amplifier and the switching power converter circuitry are powered off, and the supply voltage converter circuitry provides the converted supply voltage according to a maximum power demand of the control amplifier; and
in a transmit-state of the envelope power converter circuitry, the control amplifier and the switching power converter circuitry are powered on, and the supply voltage converter circuitry provides the converted supply voltage according to a known power demand of the control amplifier.

13. The RF transmitter circuitry of claim 12 wherein the envelope power converter circuitry further comprises switching control circuitry coupled between the control amplifier and the switching power converter circuitry and configured to generate a switching control signal for the switching power converter circuitry based on the control output current.

14. The RF transmitter circuitry of claim 12 wherein in an off-state of the envelope power converter circuitry, the control amplifier, the supply voltage converter circuitry, and the switching power converter circuitry are powered off.

15. The RF transmitter circuitry of claim 12 wherein the envelope power converter circuitry further comprises:
a supply converter holding inductor coupled between the supply voltage converter circuitry and the control amplifier; and
a supply converter smoothing capacitor coupled between the supply converter holding inductor and ground.

16. The RF transmitter circuitry of claim 15 wherein in the standby-state of the envelope power converter circuitry, the supply converter holding inductor and the supply converter smoothing capacitor are charged by the supply voltage converter circuitry.

17. The RF transmitter circuitry of claim 12 wherein:
the RF transmitter circuitry further comprises a driver-stage amplifier coupled to the final-stage amplifier and configured to receive an RF input signal and a driver-stage power supply signal and provide an intermediate RF signal to the final-stage amplifier; and
the envelope power converter circuitry further comprises voltage regulator circuitry configured to receive the supply voltage and provide the driver-stage power supply signal.

18. The RF transmitter circuitry of claim 17 wherein:
in the standby-state of the envelope power converter circuitry, the voltage regulator circuitry provides the driver-stage power supply signal according to a maximum power demand of the additional amplifier; and
in the transmit-state of the envelope power converter circuitry, the voltage regulator circuitry provides the driver-stage power supply signal according to a known power demand of an additional amplifier.

19. The RF transmitter circuitry of claim 18 wherein the envelope power converter circuitry further comprises:
a supply converter holding inductor coupled between the supply voltage converter circuitry and the control amplifier;
a supply converter smoothing capacitor coupled between the supply converter holding inductor and ground; and
a driver-stage power supply smoothing capacitor coupled between an output of the voltage regulator circuitry and ground.

20. The RF transmitter circuitry of claim 19 wherein the envelope power converter circuitry further comprises a switch coupled between the output of the voltage regulator circuitry and the supply converter holding inductor.

21. The RF transmitter circuitry of claim 20 wherein:
in the standby-state of the envelope power converter circuitry, the switch is closed such that the voltage regulator circuitry is configured to assist the supply voltage converter circuitry in charging the supply converter holding inductor and the supply converter smoothing capacitor; and
in the transmit-state of the envelope power converter circuitry, the switch is open.

22. The RF transmitter of claim 12 wherein:
the standby-state is entered between about 5-8 µs before transmission of a wireless local area network (WLAN) signal from the RF transmitter; and
the transmit-state is entered between about 2-4 µs before transmission of a WLAN signal from the RF transmitter.

* * * * *

UNITED STATES PATENT AND TRADEMARK OFFICE
CERTIFICATE OF CORRECTION

| | | |
|---|---|---|
| PATENT NO. | : 9,516,693 B2 | Page 1 of 1 |
| APPLICATION NO. | : 14/838515 | |
| DATED | : December 6, 2016 | |
| INVENTOR(S) | : Nadim Khlat et al. | |

It is certified that error appears in the above-identified patent and that said Letters Patent is hereby corrected as shown below:

In the Specification

In Column 4, Line 55, replace "RFI" with --RF_I--.

In Column 8, Lines 60 and 61, replace "SC CNT" with --SC_CNT--.

Signed and Sealed this
Twenty-eighth Day of February, 2017

Michelle K. Lee
*Director of the United States Patent and Trademark Office*